United States Patent [19]

Togawa et al.

[11] Patent Number: 6,005,030
[45] Date of Patent: Dec. 21, 1999

[54] EPOXY RESIN COMPOSITION FOR SEMICONDUCTOR SEALING AND RESIN MOLDED TYPE SEMICONDUCTOR DEVICE SEALED WITH THE EPOXY RESIN COMPOSITION

[75] Inventors: Mitsuo Togawa, Shimodate; Kazuhiko Miyabayashi, Oyama; Takahiro Horie, Shimodate; Naoki Nara, Tochigi, all of Japan

[73] Assignee: Hitachi Chemical Company, Ltd., Tokyo, Japan

[21] Appl. No.: 09/008,550

[22] Filed: Jan. 16, 1998

[30] Foreign Application Priority Data

Jan. 28, 1997 [JP] Japan .................................... 9-014193
Jan. 28, 1997 [JP] Japan .................................... 9-014194

[51] Int. Cl.⁶ ................................ C08K 5/54; C08L 63/02
[52] U.S. Cl. .......................... 523/443; 428/901; 525/481; 525/486; 525/506; 525/524
[58] Field of Search .............................. 429/901; 523/440, 523/443; 525/481, 485, 486, 506, 524

[56] References Cited

FOREIGN PATENT DOCUMENTS

| | | |
|---|---|---|
| 2-166116 | 6/1990 | Japan . |
| 3-197528 | 8/1991 | Japan . |
| 3-210325 | 9/1991 | Japan . |
| 7-70282 | 3/1995 | Japan . |
| 8-165331 | 6/1996 | Japan . |

*Primary Examiner*—Robert Dawson
*Assistant Examiner*—D. Aylward
*Attorney, Agent, or Firm*—Antonelli, Terry, Stout & Kraus, LLP

[57] ABSTRACT

An epoxy resin composition for semiconductor sealing, which comprises an epoxy resin, a curing agent and an inorganic filler, and has a J-value of 10 to 50, which is a maximum jetting flow value determined according to a method of evaluating jetting flow of epoxy resin composition.

12 Claims, 2 Drawing Sheets

EPOXY RESIN COMPOSITION FOR SEMICONDUCTOR SEALING AND RESIN MOLDED TYPE SEMICONDUCTOR DEVICE SEALED WITH THE EPOXY RESIN COMPOSITION

BACKGROUND OF THE INVENTION (a) Field of the Invention

The present invention relates to epoxy resin compositions for semiconductor sealing which can be transfer molded to produce full-molded type packages with different resin thickness for the marking side and the back, such as full-molded type power TRS (FM-type P-TRS), without leaving voids, and also to resin molded type semiconductors sealed with the epoxy resin compositions.

(b) Description of the Related Art

Resin molded type semiconductor devices are produced by sealing semiconductor elements, such as ICs, LSIs, TRSs or diodes, with thermosetting resins to protect them from the external atmosphere and mechanical shock. From the viewpoints of mass-productivity, cost and reliability, low pressure transfer molding with epoxy resin compositions, which suits mass production, is widely used to seal semiconductor elements.

The diversity of the package forms of recent resin molded type semiconductor devices increases packages having forms difficult to mold, including TSOPs (thin single outline packages), which are ultra thin packages 1 mm thick or less, and packages containing radiator plates, being about 10 mm thick and having different resin thickness for the marking side and the back, such as full-molded type transistors (FM-type TRSs), full-molded type power transistors (FM-type P-TRSs) and full-molded type ICs (FM-type ICs).

When a conventional epoxy resin composition for semiconductor sealing (hereinafter, may be called sealing resin) are transfer molded to produce packages with different sealing resin thickness for each side of an insert, such as FM-type TRSs, FM-type ICs or FM-type P-TRSs, the behavior of the sealing resin flowing into the cavity is different for the upper side (the marking side) and the lower side (the back), and makes weld marks (a kind of voids which are left at the joining points of the upper resin and the lower resin flowing separately on and under the insert during filling the cavity with the resin) on moldings. The weld marks decrease the electric properties (such as insulation voltage) and reliability in moisture resistance of resin molded type semiconductor devices. For example, when the moisture resistance is tested by a PCT at 120° C. in a steam of 2 atm, water enters from the weld marks and causes a leakage current and breakage of electrodes due to corrosion and, at a high voltage, decreases the insulation properties.

SUMMARY OF THE INVENTION

An object of the present invention is to provide epoxy resin compositions for semiconductor sealing which enable production of full-molded type packages with different resin thickness for the marking side and the back (the upper and lower sides), such as FM-type P-TRS, without making weld marks.

Another object of the present invention is to provide resin molded type semiconductor devices free of weld marks.

We have made studies to solve the above problems, and paying attention to the flow behavior of sealing resins in molds (cavity), analyzed the mechanism of the formation of weld marks and established a novel method of evaluating the flow characteristics of sealing resins. The present invention is the result of our finding that resin molded type semiconductor devices free of weld marks can be produced by sealing semiconductor elements with epoxy resin compositions having specified flow characteristics as evaluated by the evaluation method.

That is, the present invention provides an epoxy resin composition for semiconductor sealing, which comprises an epoxy resin, a curing agent and an inorganic filler, and has a J-value of 10 to 50, which is a maximum jetting flow value determined according to a method of evaluating jetting flow of epoxy resin composition.

The present invention further provides a resin molded type semiconductor device sealed with the epoxy resin composition for semiconductor sealing.

When FM-type P-TRSs are molded, a sealing resin is transferred into the cavity of a mold through a gate, then separates into two directions to flow through the upper side (the broader area) and the lower side (the narrower area) of inserts, such as-radiator plates or lead wires, and finally joins again to complete filling. However, since the resin flowing in the upper side (the broader area) and the resin flowing in the lower side (the narrower area) differ in their flow behavior, the upper side resin flows faster and flows into the lower side to join the other. Thus the air cannot be completely exhausted from an air bent, and the remaining air is engulfed in the resin at the joining point and makes weld marks (voids).

By equalizing the flow behavior of the resins flowing the upper side (the broader area) and the lower side (the narrower area) in a mold cavity, the upper side resin and the lower side resins can join together around an air bent to let out the air completely, and moldings free of weld marks (voids) are obtainable.

DESCRIPTION OF THE PREFERRED EMBODIMENTS

Because of its maximum jetting flow value (J-value) adjusted to 10 to 50 as determined according to a method of evaluating jetting flow of epoxy resin compositions, the epoxy resin composition of the present invention flows substantially equally in the upper side (the broader area) and in the lower side (the narrower area) in a mold cavity, and enables production of resin molded type semiconductor devices free of weld marks. If the J-value is less than 10, weld marks will be made, and if more than 50, short shot will occur in the upper side.

Figure 1:
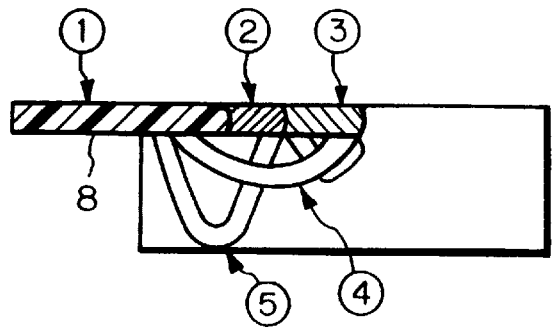
FIG. 1 is a schematic view illustrating the flow behavior of a resin.

Hereinafter, "J-value" will be explained in more detail. FIG. 1 is a schematic view illustrating the flow behavior of a resin 8 fed into a thick slit through a narrow slit (gate), and as the weight of the injected resin 8 increases, the resin 8 flows as ①→②→③→④→⑤. During ①→②→③, the resin 8 flows with the shape (thickness) passed through the gate maintained, and during ④→⑤, the flowing resin 8 changes its shape as if it is being folded. The flow of ①→②→③ is called jetting flow, which is common to thermoplastic resins.

Epoxy resin compositions (resins) which may be used in the present invention have a maximum jetting flow value (J-value) of 10 to 50.

Figure 2:
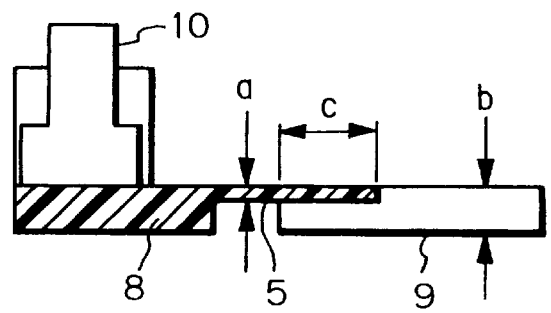
FIG. 2 is a schematic view of an apparatus for determining J-values.

The J-value is determined, as shown in FIG. 2, by injecting a sample resin 8 from a transfer molding machine through a gate 5 (channel sizes: width: 10 mm, length: 10 mm, height: a=0.8 mm) into a mold 9 (height of flow channel: b=4.0 mm), and measuring the flow distance (c: mm) through which varying amount (flow weight: mg) of injected resin 8 flows. A referential numeral 10 indicates a plunger. The transfer molding is conducted under the conditions of plunger pressure: 100 kgf/cm$^2$, mold temperature: 175° C., no pre-heating, transfer time: 5 seconds, varying amount of a sample resin: 5 to 10 g.

Figure 3:
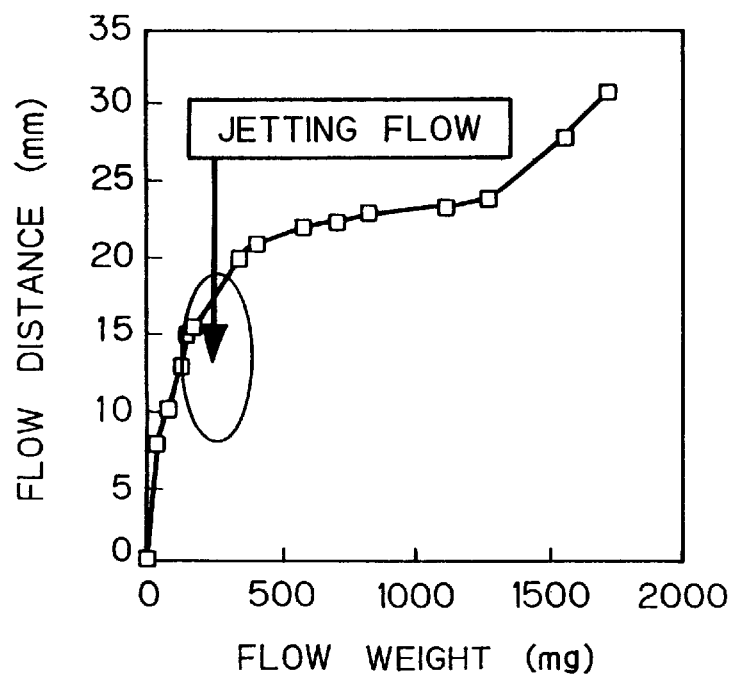
FIG. 3 is a graph showing a relationship of flow distance with flow weight.

Then a graph as shown in FIG. 3 is made with flow weight on the horizontal axis and flow distance vertically. The inclination of the graph decreases as the flow weight increases, and increases again as the flow weight further increases. The part of a large inclination during the initial flow indicates "Jetting flow".

Figure 4:
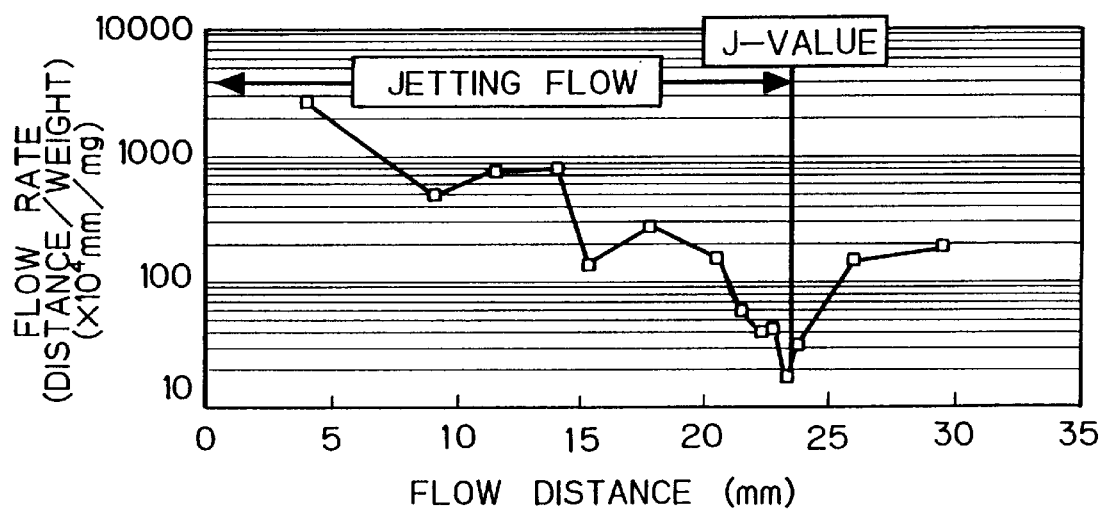
FIG. 4 is a graph showing the relationship of the flow rate determined from the data as shown in FIG. 3 with flow distance.

Then a graph as shown in FIG. 4 is made by differentiating the graph of FIG. 3 with flow weight. In this graph the vertical axis is flow rate (distance/weight) which corresponds to the inclination of the graph of FIG. 3, and the horizontal axis is flow distance. The flow rate decreases as the flow distance increases, and then increases as the flow distance further increases. In the present invention, the flow distance at which the flow rate is minimized is defined as the "J-value". Resins make jetting flow until flow rate is minimized.

Epoxy resins which may be used in the present invention are any compounds which have at least two epoxy groups per molecule, including monomers, oligomers and polymers, and typical examples include biphenyl type epoxy compounds, bis phenol type epoxy compounds, such as bisphenol A epoxy resin, bisphenol F epoxy resin and bisphenol S epoxy resin, phenol novolac epoxy resin, cresol novolac epoxy resin, triphenolmethane type epoxy compounds, alkyl-modified triphenolmethane type epoxy compounds, epoxy resins containing at least one triazine nucleus, and halogenation products thereof, such as brominated bisphenol A epoxy resin. These may be used individually or in combination of two ore more.

Curing agents which may be used in the present invention are not particularly limited, and preferred examples are phenolic resin type curing agents. Typical examples of phenolic resin type curing agents include phenol novolac resin, cresol novolac resin, dicyclopentadiene-modified phenolic resin, terpene-modified phenolic resin and triphenolmethane compounds. These may be used individually or in combination of two or more.

Curing agents are compounded so that epoxy groups of the epoxy resin and hydroxyl groups of the phenolic resin are preferably in a number ratio of epoxy groups/hydroxyl groups of 0.6 to 1.4, more preferably 0.8 to 1.2.

The inorganic filler to be used in the present invention is preferably a powdery inorganic filler, and examples of powdery inorganic fillers include crystalline silica powder, alumina powder, silicon nitride powder and fused silica powder, which may be used individually or in combination of two or more.

The amount of inorganic fillers is generally 60 to 95% by weight, preferably 70 to 90% by weight, based on the total of the epoxy resin composition of the present invention.

The J-value of the epoxy resin composition of the present invention can be adjusted to 10 to 50 by properly selecting the kind, shape, average particle size, distribution of particle size, combination and amounts of inorganic fillers used.

For example, to adjust the J-value to 10 to 50, it is preferable to use powdery inorganic fillers containing 15 to 50% by weight, preferably 15 to 25% by weight of particles of 75 to 150 μm in particle size. Particularly preferred powdery inorganic fillers contain 15 to 50% by weight of particles of 75 to 150 μm in particle size and 50 to 85% by weight of particles of less than 75 μm in particle size, more preferably 15 to 25% by weight of particles of 75 to 150 μm in particle size and 75 to 85% by weight of particles of less than 75 μm in particle size. Such powdery inorganic fillers are compounded preferably in an amount of 60 to 95% by weight, more preferably 70 to 90% by weight, based on the total of the epoxy resin composition. Herein, the distribution of the particle size of powdery inorganic fillers is determined according to JIS-K-6910, paragraph 4.5, "Residue on Sieve".

Preferred powdery inorganic fillers have an angular shape or an obtusely angular shape.

The epoxy resin compositions of the present invention may optionally contain cure accelerators. The cure accelerators may be any ones which accelerate the curing reaction of epoxy resins with compounds having phenolic hydroxyl groups. Typical examples include tertiary amines, such as 1,8-diazabicyclo(5.4.0)undecene-7, triethylenediamine, benzyldimethylamine, dimethylaminoethanol and tris (dimethylaminomethyl)phenol, imidazoles, such as 2-methylimidazole, 2-phenylimidazole and 2-heptadecylimidazole, organic phosphines, such as tributylphosphine, methyldiphenylphosphine, triphenylphosphine, diphenylphosphine and phenylphosphine, tetra-substituted phosphoniumtetra-substituted borates, such as tetraphenylphosphonium tetraphenylborate, tetraphenylphosphonium ethyltriphenylborate and tetrabutylphosphonium tetrabutylborate, and tetraphenylboron salts, such as 2-ethyl-4-methylimidazole tetraphenylborate and N-methylmorpholine tetraphenylborate. These may be used individually or in combination of two or more.

The amount of cure accelerators is preferably 0.5 to 12.0% by weight based on the total of epoxy resins.

The epoxy resin compositions of the present invention may optionally contain other additives, such as coloring agents, such as carbon black, mold release agents, such as natural waxes, synthetic waxes, higher fatty acids, metal salts of higher fatty acids and ester waxes, coupling agents of silane type, such as epoxysilane, aminosilane, vinylsilale and alkylsilanes, titanium type, such as organic titanates, and aluminum type, such as aluminum alcoholate, stress relieving agents, such as silicone oils and rubbers. Flame retardants, such as antimony oxide and red phosphorus, may also be added to contribute non-flammability.

In general, the amount of coloring agents is not more than 5% by weight, for example 0.01 to 5% by weight, the amount of mold release agents is not more than 5% by weight, preferably 1 to 5% by weight, the amount of coupling agents is not more than 15% by weight, preferably 0.1 to 15% by weight, the amount of stress relieving agents is not more than 50% by weight, and the amount of flame retardants is not more than 30% by weight, preferably 0.1 to 30% by weight, all based on the total of epoxy resins.

The epoxy resin compositions for semiconductor sealing of the present invention may be prepared, for example, by mixing the above-described components uniformly in pre-determined ratios, kneading the mixture in a kneader, roll or extruder pre-heated to 70 to 95° C., extruding, cooling and grinding.

Hereinafter, the present invention will be described in detail referring to Examples and Comparative Examples, but is not limited to the Examples.

EXAMPLES 1 TO 4 AND COMPARATIVE EXAMPLES 1 AND 2

The raw materials as listed in Table 1 were compounded to produce epoxy resin compositions (sealing materials) containing their respective inorganic fillers of different properties (kind, shape and distribution of particle size).

The raw materials were pre-mixed (dry blending), kneaded with a biaxial mixing roll (temperature of roll surface: about 70 to 80° C.) for 10 minutes, cooled and then finely ground, to obtain sealing materials.

Spiral flow of each sealing material was then measured by using a transfer molding machine under the conditions of molding temperature: 180° C., molding pressure: 70 kgf/cm$^2$ and curing time: 90 seconds. Melt viscosity at 180° C. was also measured with a Koka-type flow tester produced by Shimazu Seisakusho Co., Ltd. Determination of J-value was then carried out with the above-described mold for evaluating jetting flow.

FM-type P-TRSs were molded by using a mold for FM-type P-TRS at 180° C. at 70 kgf/cm$^2$ for 90 seconds, and the surfaces of moldings were visually observed for the presence of weld marks of 1 mmφ or more. Also the obtained FM-type P-TRSs were tested for electrical properties and moisture resistance (test for malfunction occurred after to PCT for 1000 hours). The results are shown in Table 2.

Figure 5:
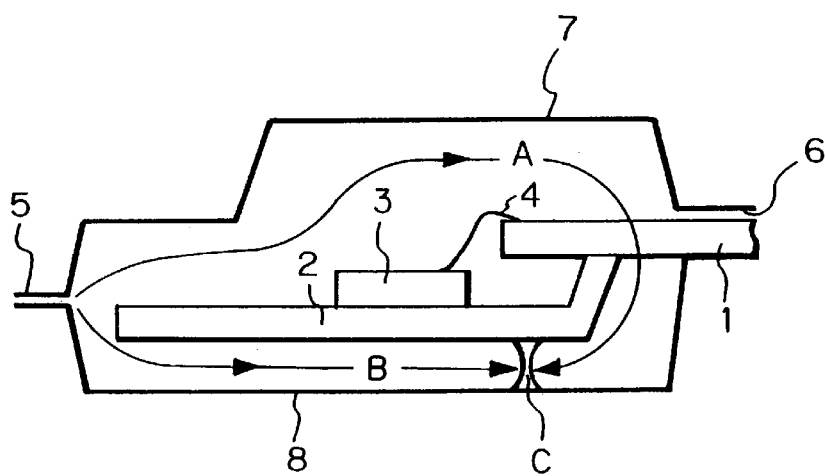
FIG. 5 is a schematic, sectional view illustrating molding of an FM-type P-TRS with an epoxy resin composition for semiconductor sealing.

FIG. 5 is a schematic, sectional view illustrating an FM-type P-TRS being molded with an epoxy resin composition for semiconductor sealing, and 1 is a lead frame, 2 is a header, 3 is a tip, 4 is a wire, 5 is a gate, and 6 is an air vent. An epoxy resin composition (resin) is injected through a gate into a mold. The resin fed through the gate flows into two directions, the marking side 7 and the back 8. Since the resin flows in the mold faster in the broader area A and slowly in the narrower area B, the resins flowing A and B join together at C, where voids due to the engulfed air are made. The defect containing voids (a kind of short shot) is so-called weld mark. The backs of the obtained moldings were visually observed for the presence of weld marks of 0.1 mmφ or more.

TABLE 1

|  | Unit | Example Nos. 1 | 2 | 3 | 4 | Comp. Example Nos. 1 | 2 |
|---|---|---|---|---|---|---|---|
| (1) Ortho-cresol novolac epoxy resin (epoxy group equivalent weight: 200) | wt % | 6.3 | 6.3 | 6.3 | 10.8 | 10.3 | 14.2 |
| (2) Biphenyl type epoxy resin (epoxy group equivalent weight: 195) |  | 3.4 | 3.4 | 3.4 | — | — | — |
| (3) Brominated bisphenol A epoxy resin (epoxy group equivalent weight: 395, Br content: 48 wt %) |  | 1.7 | 1.7 | 1.7 | 1.9 | 1.8 | 2.5 |
| (4) Phenol novolac resin (hydroxyl group equivalent weight: 106) |  | 5.7 | 5.7 | 5.7 | 6.4 | 6.0 | 8.4 |
| (5) Triphenyl phosphine |  | 0.2 | 0.2 | 0.2 | 0.2 | 0.2 | 0.2 |
| (6) Montanic acid wax |  | 0.3 | 0.3 | 0.3 | 0.3 | 0.3 | 0.3 |
| (7) Epoxysilane |  | 0.7 | 0.7 | 0.7 | 0.7 | 0.7 | 0.7 |
| (8) Carbon black |  | 0.1 | 0.1 | 0.1 | 0.1 | 0.1 | 0.1 |
| (9) Antimony trioxide |  | 0.6 | 0.6 | 0.6 | 0.6 | 0.6 | 0.6 |
| (10) Inorganic filler (wt % in a composition) |  | 81.0 | 81.0 | 81.0 | 79.0 | 80.0 | 73.0 |
| Properties of powdery inorganic filler |  |  |  |  |  |  |  |
| Kind |  |  |  |  |  |  |  |
| Crystalline silica | wt % | 59.0 | 59.0 | 59.0 | 63.0 | 68.0 | 73.0 |
| Fused silica |  | 22.0 | 22.0 | 22.0 | 16.0 | 12.0 | — |
| Shape |  |  |  |  |  |  |  |
| Angular | wt % | 81.0 | — | — | 16.0 | 16.0 | 73.0 |
| Obtusely angular |  | — | 81.0 | 59.0 | 63.0 | 52.0 | — |
| Spherical |  | — | — | 22.0 | — | 12.0 | — |
| Distribution of particle size |  |  |  |  |  |  |  |
| Particle size: 75–150 μm | wt % | 23.0 | 23.0 | 23.0 | 81.0 | 3.0 | 2.0 |
| Particle size: <75 μm |  | 77.0 | 77.0 | 77.0 | 82.0 | 97.0 | 98.0 |

TABLE 2

|  | Example Nos. | | | | Comp. Example Nos. | |
| --- | --- | --- | --- | --- | --- | --- |
|  | 1 | 2 | 3 | 4 | 1 | 2 |
| Spiral flow (in) | 22.0 | 22.5 | 25.0 | 23.0 | 25.0 | 40.5 |
| Melt viscosity (180° C.) (poise) | 640 | 560 | 450 | 600 | 400 | 150 |
| J-value | 19 | 18 | 15 | 10 | 8 | 3 |
| Moldability of FM-type P-TRS (numbers of moldings with weld marks) | 0/20 | 0/20 | 0/20 | 0/20 | 15/20 | 20/20 |
| Electrical properties of FM-type P-TRS (any decrease in isolation voltage) | No | No | No | No | Yes | Yes |
| Moisture resistance of FM-type P-TRS (numbers of moldings in which wires were corroded) | 0/20 | 0.20 | 0/20 | 0/20 | 10/20 | 20/20 |

The results show that resin molded type semiconductor devices free of weld marks could be produced by using the epoxy resin compositions for semiconductor sealing of the present invention even though the resin molded type semiconductor devices were full-molded type packages with different resin thickness for the marking side and the back (the upper and lower sides), namely FM-type P-TRSs.

What is claimed is:

1. An epoxy resin composition for semiconductor sealing, which comprises an epoxy resin, a curing agent and an inorganic filler, and has a J-value of 10 to 50, which is a maximum jetting flow value determined according to a method of evaluating jetting flow of epoxy resin composition, wherein the inorganic filler is a powdery inorganic filler comprising 15 to 50% by weight of particles of 75 to 150 μm in particle size and 50 to 85% by weight of particles of less than 75 μm in particle size, and wherein the inorganic filler is 60–95% by weight based on a total of the epoxy resin composition.

2. The epoxy resin composition for semiconductor sealing of claim 1, wherein the powdery inorganic filler comprises 15 to 25% by weight of particles of 75 to 150 μm in particle size and 75 to 85% by weight of particles of less than 75 μm in particle size.

3. The epoxy resin composition for semiconductor sealing of claim 1, wherein the powdery inorganic filler has an angular shape or an obtusely angular shape.

4. The epoxy resin composition for semiconductor sealing of claim 1, wherein the powdery inorganic filler is selected from the group consisting of crystalline silica powder, alumina powder, silicon nitride powder, fused silica powder and a mixture thereof.

5. The epoxy resin composition for semiconductor sealing of claim 1, wherein the curing agent is a phenolic resin, and the epoxy resin and the phenolic resin are in such amounts that epoxy groups of the epoxy resin and hydroxyl groups of the phenolic resin are in a number ratio of epoxy groups/hydroxyl groups of 0.6 to 1.4.

6. The epoxy resin composition for semiconductor sealing of claim 1, which further comprises 0.5 to 12.0% by weight of a cure accelerator based on a weight of the epoxy resin, the cure accelerator being selected from the group consisting of a tertiary amine, an imidazole compound, an organic phosphine, a tetra-substituted phosphonium tetra-substituted borate and a tetraphenylboron salt.

7. The epoxy resin composition for semiconductor sealing of claim 1, which further comprises not more than 5% by weight of a coloring agent, not more than 5% by weight of a mold release agent, not more than 15% by weight of a coupling agent and not more than 30% by weight of a flame retardant, all based on a weight of the epoxy resin.

8. The epoxy resin composition for semiconductor sealing of claim 1, wherein the epoxy resin is a mixture of an orthocresol novolac epoxy resin, a biphenyl epoxy resin and a brominated bisphenol A epoxy resin, the curing agent is a phenolic novolac resin, the inorganic filler is a powdery inorganic filler which comprises a mixture of a crystalline silica powder and a fused silica powder, the powdery inorganic filler comprising 15 to 50% by weight of particles of 75 to 150 μm in particle size and 50 to 85% by weight of particles of less than 75 μm in particle size, and being 60 to 95% by weight based on a total weight of the epoxy resin composition.

9. A resin molded semiconductor device sealed with the epoxy resin composition for semiconductor sealing of claim 1.

10. The epoxy resin composition for semiconductor sealing of claim 6, which further comprises not more than 5% by weight of a coloring agent, not more than 5% by weight of a mold release agent, not more than 15% by weight of a coupling agent and not more than 30% by weight of a flame retardant, all based on a weight of the epoxy resin.

11. The resin molded semiconductor device of claim 9, wherein a thickness of the resin molding at a marking side of the semiconductor device is greater than a resin molding at a back side of the semiconductor device, said back side being opposite to said marking side.

12. The epoxy resin composition for semiconductor sealing of claim 1, wherein the inorganic filler is 70–95% by weight based on the total of the epoxy resin composition.

* * * * *